US012618901B2

(12) United States Patent
Bae

(10) Patent No.: US 12,618,901 B2
(45) Date of Patent: May 5, 2026

(54) BATTERY MANAGEMENT MODULE AND METHOD FOR DETECTING DEFECTIVE NAND GATE CIRCUIT IN BATTERY MANAGEMENT MODULE

(71) Applicant: SAMSUNG SDI CO., LTD., Yongin-si (KR)

(72) Inventor: Jin Cheol Bae, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 206 days.

(21) Appl. No.: 18/637,726

(22) Filed: Apr. 17, 2024

(65) Prior Publication Data

US 2025/0147100 A1 May 8, 2025

(30) Foreign Application Priority Data

Nov. 3, 2023 (KR) ........................ 10-2023-0151220

(51) Int. Cl.
*G01R 31/317* (2006.01)
*H01M 10/42* (2006.01)
*H03K 19/20* (2006.01)
*H02J 7/00* (2006.01)

(52) U.S. Cl.
CPC .... *G01R 31/31703* (2013.01); *H01M 10/425* (2013.01); *H03K 19/20* (2013.01); *H01M 2010/4271* (2013.01); *H02J 7/0047* (2013.01)

(58) Field of Classification Search
None
See application file for complete search history.

(56) References Cited

U.S. PATENT DOCUMENTS 5,321,354 A * 6/1994 Ooshima ............. G06F 11/2273
714/736
11,065,979 B1 7/2021 Demont et al.
2023/0009240 A1 1/2023 Li et al.

FOREIGN PATENT DOCUMENTS

| CN | 216848073 U | 6/2022 |
|---|---|---|
| JP | 6-70476 A | 3/1994 |
| JP | 9-298846 A | 11/1997 |
| JP | 3948435 B2 | 4/2007 |
| KR | 10-0781792 B1 | 11/2007 |

OTHER PUBLICATIONS

European Search Report dated Apr. 4, 2025.

* cited by examiner

*Primary Examiner* — Jas A Sanghera
(74) *Attorney, Agent, or Firm* — Lee IP Law, P.C.

(57) ABSTRACT

A battery management module, including a microcontroller unit, a first comparator configured to compare an input signal with a first reference signal and output a first comparison result and a NAND gate circuit configured to receive a first input from the microcontroller unit and a second input that is the first comparison result from the first comparator to generate an output signal, wherein, in an inspection mode, the first comparator is connected to a battery module tester, the microcontroller unit outputs a low-level signal as the first input, the first comparator receives the input signal from the battery module tester and outputs a low-level signal as the first comparison result and the microcontroller unit is further configured to receive the output signal of the NAND gate circuit and determine the NAND gate circuit is defective in response to the output signal of the NAND gate circuit being a low-level signal.

20 Claims, 10 Drawing Sheets

100

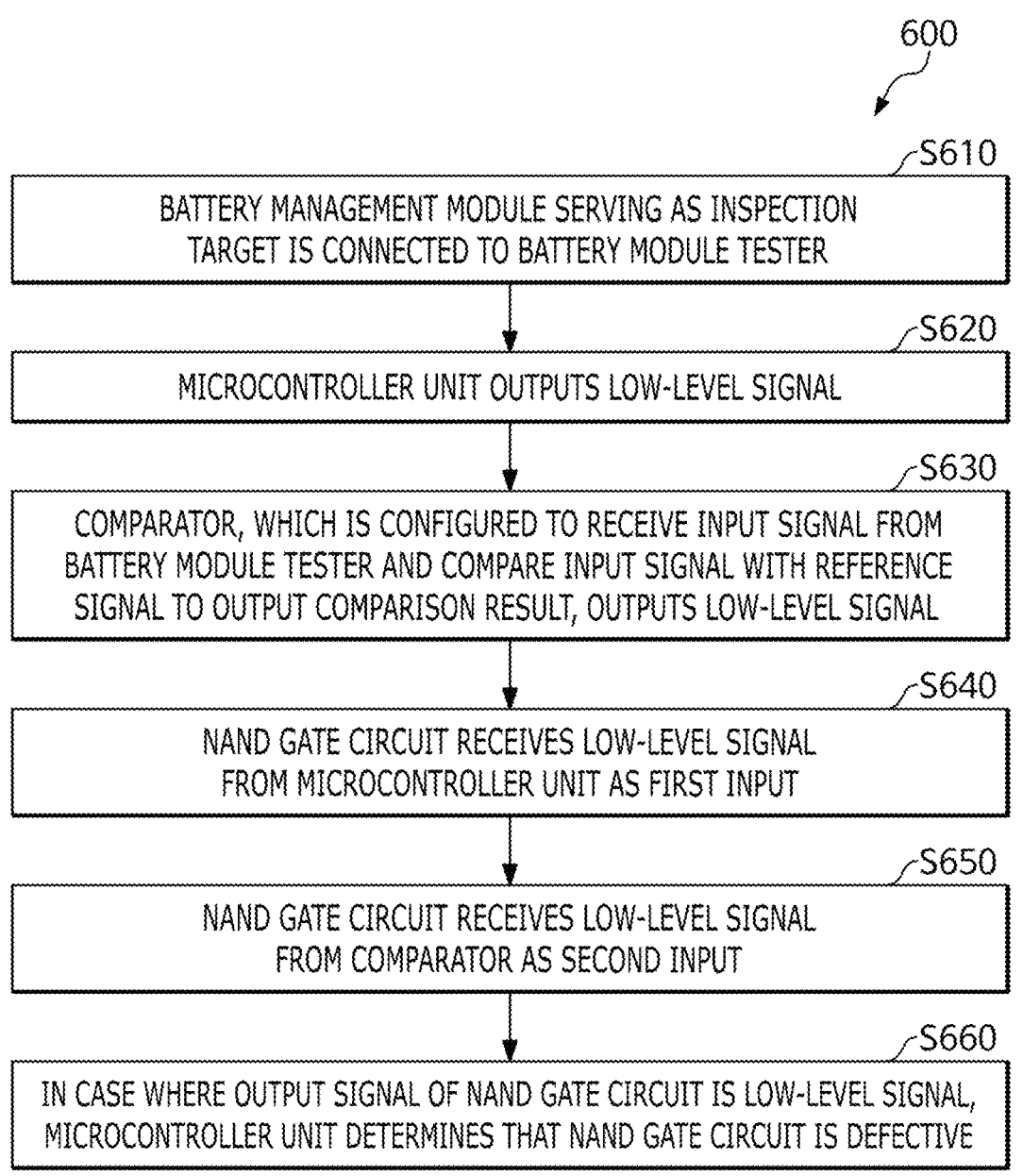

600

S610
BATTERY MANAGEMENT MODULE SERVING AS INSPECTION TARGET IS CONNECTED TO BATTERY MODULE TESTER

S620
MICROCONTROLLER UNIT OUTPUTS LOW-LEVEL SIGNAL

S630
COMPARATOR, WHICH IS CONFIGURED TO RECEIVE INPUT SIGNAL FROM BATTERY MODULE TESTER AND COMPARE INPUT SIGNAL WITH REFERENCE SIGNAL TO OUTPUT COMPARISON RESULT, OUTPUTS LOW-LEVEL SIGNAL

S640
NAND GATE CIRCUIT RECEIVES LOW-LEVEL SIGNAL FROM MICROCONTROLLER UNIT AS FIRST INPUT

S650
NAND GATE CIRCUIT RECEIVES LOW-LEVEL SIGNAL FROM COMPARATOR AS SECOND INPUT

S660
IN CASE WHERE OUTPUT SIGNAL OF NAND GATE CIRCUIT IS LOW-LEVEL SIGNAL, MICROCONTROLLER UNIT DETERMINES THAT NAND GATE CIRCUIT IS DEFECTIVE

BATTERY MANAGEMENT MODULE AND METHOD FOR DETECTING DEFECTIVE NAND GATE CIRCUIT IN BATTERY MANAGEMENT MODULE

CROSS-REFERENCE TO RELATED APPLICATION

The present application claims priority to and the benefit of Korean Application No. 10-2023-0151220, filed on Nov. 3, 2023, in the Korean Intellectual Property Office, the entire disclosure of which is incorporated by reference herein.

BACKGROUND

1. Field

Aspects of embodiments of the present disclosure relate to a battery management module and a method for detecting a defective NAND gate circuit in the battery management module. More specifically, aspects of embodiments of the present disclosure relate to the battery management module capable of detecting a defect of a NAND gate circuit and the method for detecting the defective NAND gate circuit and the method for detecting the defective NAND gate circuit.

2. Description of Related Art

Secondary batteries are rechargeable batteries that are designed to be discharged and recharged multiple times. These secondary batteries are mainly used in various applications such as electronic devices (smart phones, notebook computers, tablets, etc.), electric vehicles, solar photovoltaics and emergency power supplies. In particular, lithium-ion batteries are used in various electronic devices and electric vehicles due to their high energy density and efficient charge/discharge capability.

Since repeatedly charging and discharging secondary batteries, especially rechargeable batteries such as lithium-ion batteries, may shorten the lifespan thereof or degrade their performance, electric vehicles and the like are equipped with a battery management system to periodically monitor the state of the battery. Generally, the battery management system is configured to monitor a battery voltage, a current, a temperature, and the like, and manage battery charging and discharging.

Meanwhile, for a function of detecting overvoltage or undervoltage of the battery cell voltage among various functions of the battery management system, a logic circuit may be employed. However, if the power supply to the logic circuit is defective, the defects may not be detected due to the input and output operation characteristics of the logic circuit.

The above information disclosed in this Background section is for enhancement of understanding of the background of the present disclosure, and therefore, it may contain information that does not constitute related (or prior) art.

SUMMARY

Embodiments include a battery management module. The battery management module includes a microcontroller unit (MCU), a first comparator configured to compare an input signal with a first reference signal and output a first comparison result and a NAND gate circuit configured to receive a first input from the microcontroller unit and a second input that is the first comparison result from the first comparator to generate an output signal, wherein, in an inspection mode, the first comparator is connected to a battery module tester, the microcontroller unit outputs a low-level signal as the first input, the first comparator receives the input signal from the battery module tester and outputs a low-level signal as the first comparison result, and the microcontroller unit is further configured to receive the output signal of the NAND gate circuit and determine that the NAND gate circuit is defective in response to the output signal of the NAND gate circuit being a low-level signal.

The battery management module may further include a pull-up resistor having one end connected to an output terminal of the NAND gate circuit and the other end connected to a power source of the NAND gate circuit and a second comparator configured to compare the output signal of the NAND gate circuit with a second reference signal and output a second comparison result, wherein an output terminal of the first comparator is connected to an alarm input interface included in the microcontroller unit, an output terminal of the second comparator is connected to an alarm output feedback interface included in the microcontroller unit, and the one end of the pull-up resistor may be additionally connected to a NAND gate monitoring interface included in the microcontroller unit.

In the inspection mode, the first comparator may receive the input signal, which has a voltage lower than that of the first reference signal, from the battery module tester and outputs the low-level signal as the first comparison result.

The defective NAND gate circuit may be indicative of an abnormal power supply state of the NAND gate circuit.

In the inspection mode, the microcontroller unit may receive the low-level signal output from the NAND gate circuit through the NAND gate monitoring interface, and the microcontroller unit may further be configured to detect the defective NAND gate circuit based on the received low-level signal.

In the inspection mode, the microcontroller unit may be further configured to, in response to the determination of the defective NAND gate circuit, transmit a signal associated with the defect of the defective NAND gate circuit to the battery module tester.

The signal associated with the defect of the defective NAND gate circuit may be transmitted to the battery module tester through a controller area network (CAN) communication interface included in the microcontroller unit.

In a normal operating mode, the battery management module may be connected to at least one of a battery cell, a preceding battery management module, a subsequent battery management module and a battery management master module.

In the normal operating mode, the microcontroller unit may be further configured to receive a voltage measurement value of the at least one battery cell or a temperature measurement value of the at least one battery cell.

In the normal operating mode, an alarm signal received from the preceding battery management module may be used as the input signal of the first comparator.

In the normal operating mode, if the alarm signal received from the preceding battery management module is a low-level signal, the low-level signal indicates that at least one preceding battery cell included in the preceding battery management module has an overvoltage state or an undervoltage state.

In the normal operating mode, the output signal of the NAND gate circuit may be transmitted to the subsequent battery management module.

In the normal operating mode, if the output signal of the NAND gate circuit is the low-level signal, the low-level signal may indicate that the at least one battery cell has an overvoltage state or an undervoltage state.

In the normal operating mode, the microcontroller unit may be further configured to transmit, to the battery management master module, state information of the battery management module, the state information being determined using at least one of a voltage measurement value of at least one battery cell, a temperature measurement value of at least one battery cell, the output signal of the NAND gate circuit, the first comparison result and the second comparison result.

Embodiments include a method for detecting a defective NAND gate circuit in a battery management module. The method includes, in an inspection mode, connecting a battery management module serving as an inspection target to a battery module tester, outputting, by a microcontroller unit, a low-level signal through a defect management interface included in the microcontroller unit, outputting, by a comparator, a low-level signal, wherein the comparator is configured to receive an input signal from the battery module tester and compare the input signal with a reference signal to output a comparison result, receiving, by a NAND gate circuit, a first input that is the low-level signal transmitted from the defect management interface included in the microcontroller unit, receiving, by the NAND gate circuit, a second input that is the low-level signal transmitted from the comparator, outputting, by the NAND gate circuit, a low-level signal based on the first input and the second input and determining, by the microcontroller unit, that the NAND gate circuit is defective if an output signal of the NAND gate circuit is the low-level signal.

The outputting, by the comparator, of the low-level signal includes receiving from the battery module tester the input signal having a voltage lower than that of the reference signal and outputting the low-level signal as the comparison result.

The defective NAND gate circuit may be indicative of an abnormal power supply state of the NAND gate circuit.

The determining, by the microcontroller unit, that the NAND gate circuit is defective includes receiving, by the microcontroller unit, the output signal of the NAND gate circuit through a NAND gate monitoring interface and detecting, by the microcontroller unit, the defective NAND gate circuit in response to determining that the received output signal of the NAND gate circuit is the low-level signal.

The method may further include transmitting, by the microcontroller unit, a signal associated with a defect of the defective NAND gate circuit to the battery module tester in response to determining that the NAND gate circuit is defective.

The signal associated with the defect of the defective NAND gate circuit may be transmitted to the battery module tester through a controller are network (CAN) communication interface included in the microcontroller unit.

These and other aspects and features of the present disclosure will be described in or will be apparent from the following description of embodiments of the present disclosure.

BRIEF DESCRIPTION OF DRAWINGS

The following drawings attached to this specification illustrate embodiments of the present disclosure, and further describe aspects and features of the present disclosure together with the detailed description of the present disclosure. Thus, the present disclosure should not be construed as being limited to the drawings:

FIG. 6 is a flowchart of a method for detecting a defective NAND gate circuit in a battery management module according to one or more embodiments of the present disclosure;

DETAILED DESCRIPTION

Figure 1:
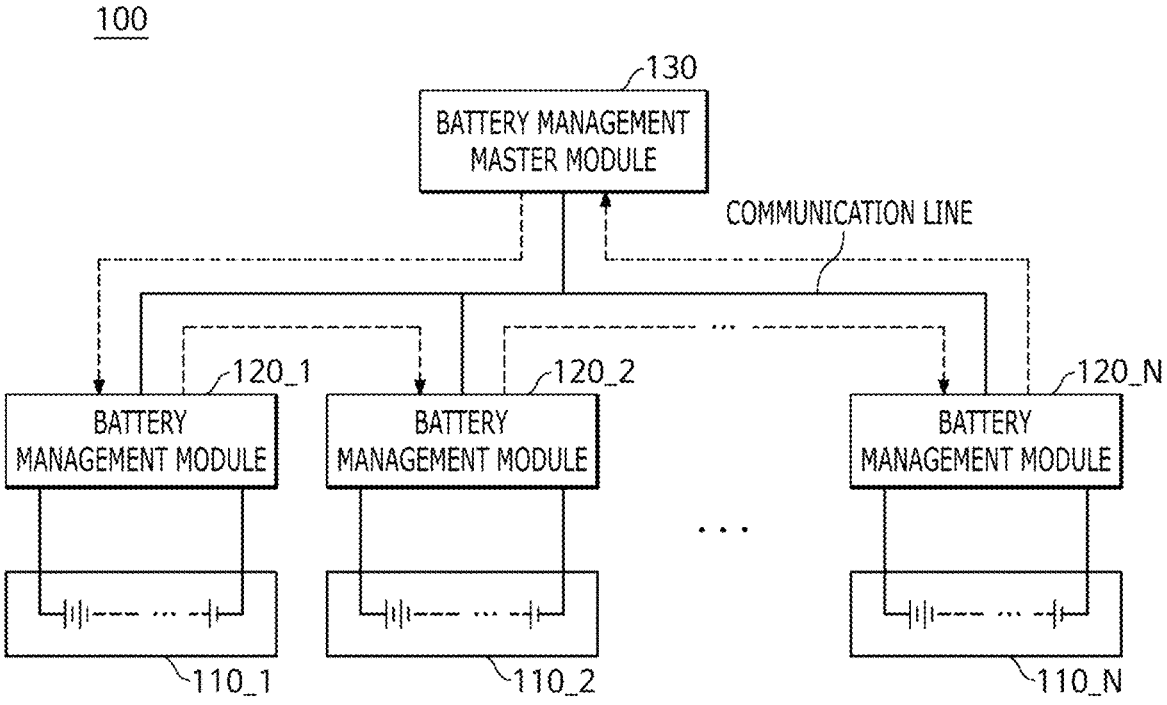
FIG. 1 is a diagram illustrating a schematic configuration of a battery management system according to one or more embodiments of the present disclosure.

Hereinafter, embodiments of the present disclosure will be described, in detail, with reference to the accompanying drawings. The terms or words used in this specification and claims should not be construed as being limited to the usual or dictionary meaning and should be interpreted as meaning and concept consistent with the technical idea of the present disclosure based on the principle that the inventor can be his/her own lexicographer to appropriately define the concept of the term to explain his/her invention in the best way.

The embodiments described in this specification and the configurations shown in the drawings are only some of the embodiments of the present disclosure and do not represent all of the technical ideas, aspects, and features of the present disclosure. Accordingly, it should be understood that there may be various equivalents and modifications that can replace or modify the embodiments described herein at the time of filing this application.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. When phrases such as "at least one of" A, B and C, "at least one of A, B or C," "at least one selected from a group of A, B and C," or "at least one selected from among A, B and C" are used to designate a list of elements A, B and C, the phrase may refer to any and all suitable combinations or a subset of A, B and C, such as A, B, C, A and B, A and C, B and C, or A and B and C. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

References to two compared elements, features, etc. as being "the same" may mean that they are "substantially the same". Thus, the phrase "substantially the same" may include a case having a deviation that is considered low in the art, for example, a deviation of 5% or less. In addition, when a certain parameter is referred to as being uniform in a given region, it may mean that it is uniform in terms of an average.

Throughout the specification, unless otherwise stated, each element may be singular or plural.

Arranging an arbitrary element "above (or below)" or "on (under)" another element may mean that the arbitrary element may be disposed in contact with the upper (or lower) surface of the element, and another element may also be interposed between the element and the arbitrary element disposed on (or under) the element.

In addition, it will be understood that when a component is referred to as being "linked," "coupled," or "connected" to another component, the elements may be directly "coupled," "linked" or "connected" to each other, or another component may be "interposed" between the components".

Throughout the specification, when "A and/or B" is stated, it means A, B or A and B, unless otherwise stated. That is, "and/or" includes any or all combinations of a plurality of items enumerated. When "C to D" is stated, it means C or more and D or less, unless otherwise specified.

FIG. 1 is a diagram illustrating a schematic configuration of a battery management system 100 according to one or more embodiments of the present disclosure. The battery management system 100 may be configured to monitor a voltage, a current, a temperature, and the like of a battery cell to monitor the state of the battery cell and manage charging and discharging of the battery.

Referring to FIG. 1, the battery management system 100 according to one or more embodiments of the present disclosure may include one or more battery management modules 120_1 to 120_N (120_1, 120_2, . . . , 120_N) and a battery management master module 130. The one or more battery management modules 120_1 to 120_N may be connected to one or more battery modules 110_1 to 110_N (110_1, 110_2, . . . , 110_N), respectively. Each of the one or more battery modules 110_1 to 110_N may include a plurality of battery cells, and each of the one or more battery management modules 120_1 to 120_N may be configured to monitor the states of the battery cells within the corresponding battery module. Further, the battery management master module 130 may be configured to receive state information of the battery cells associated with individual battery management modules from the one or more battery management modules 120_1 to 120_N.

In some embodiments, the battery management system 100 may be configured such that the battery management master module 130 receives information associated with the states of the battery cells in a daisy chain fashion from one or more of the battery management modules 120_1 to 120_N. For example, the battery management module may accumulate state information from one or more preceding battery management modules and transmit the accumulated state information to the subsequent battery management module. In a further example, a first battery management module 120_1 may receive state information of a first battery module 110_1 and transmit the received state information to a second battery management module 120_2. The second battery management module 120_2 may receive the state information of the first battery module 110_1 and state information of a second battery module 110_2, and transmit the received state information to the subsequent (third) battery management module. The N-th battery management module 120_N may transmit the state information of the first battery module 110_1 to state information of the N-th battery module 110_N to the battery management master module 130.

If a subsequent battery management module receives abnormal state information from a preceding battery management module, the subsequent battery management module may sequentially transmit the abnormal state information to the battery management master module 130. The specific method of transmitting state information of battery cells in the daisy chain fashion is not limited to the foregoing examples and may be accomplished in various ways.

In some embodiments, the battery management system 100 may be configured such that the battery management master module 130 receives, directly from each of the battery management modules 120_1 to 120_N, state information of battery cells and/or information associated with a defect of the corresponding battery management module. For example, each of the battery management modules 120_1 to 120_N may be configured to be in communication with the battery management master module 130, and each of the battery management modules 120_1 to 120_N may transmit state information of the corresponding battery cells and/or information associated with a defect of the corresponding battery management module to the battery management master module 130. In one or more embodiments, each of the battery management modules 120_1 to 120_N may be in communication with the battery management master module 130 through a communication line (e.g., a controller area network (CAN) communication).

During the end-of-line test (EOL test) stage of the battery management module manufacturing process, the battery management module may be connected to a battery module tester and the battery module tester may determine whether the battery management module is defective or not. In some embodiments, the battery module tester and/or the battery management module may be configured to determine a defect of a NAND gate circuit in the battery management module in an inspection mode. In order to determine the defect of the NAND gate circuit, in the inspection mode of the battery management module, a low-level signal may be input to the NAND gate as a first input and a low-level signal may be input to the NAND gate as a second input. If a low-level signal is output instead of the expected high-level signal from the NAND gate, the battery module tester and/or battery management module may determine that the NAND gate circuit is defective.

With the above-described configuration, it is possible to easily and quickly detect the defective NAND gate circuit in each of the battery management module 120_1 to 120_N during the EOL test stage of the battery management module manufacturing process, thereby reducing the defect rate of the battery management module.

Figure 2:
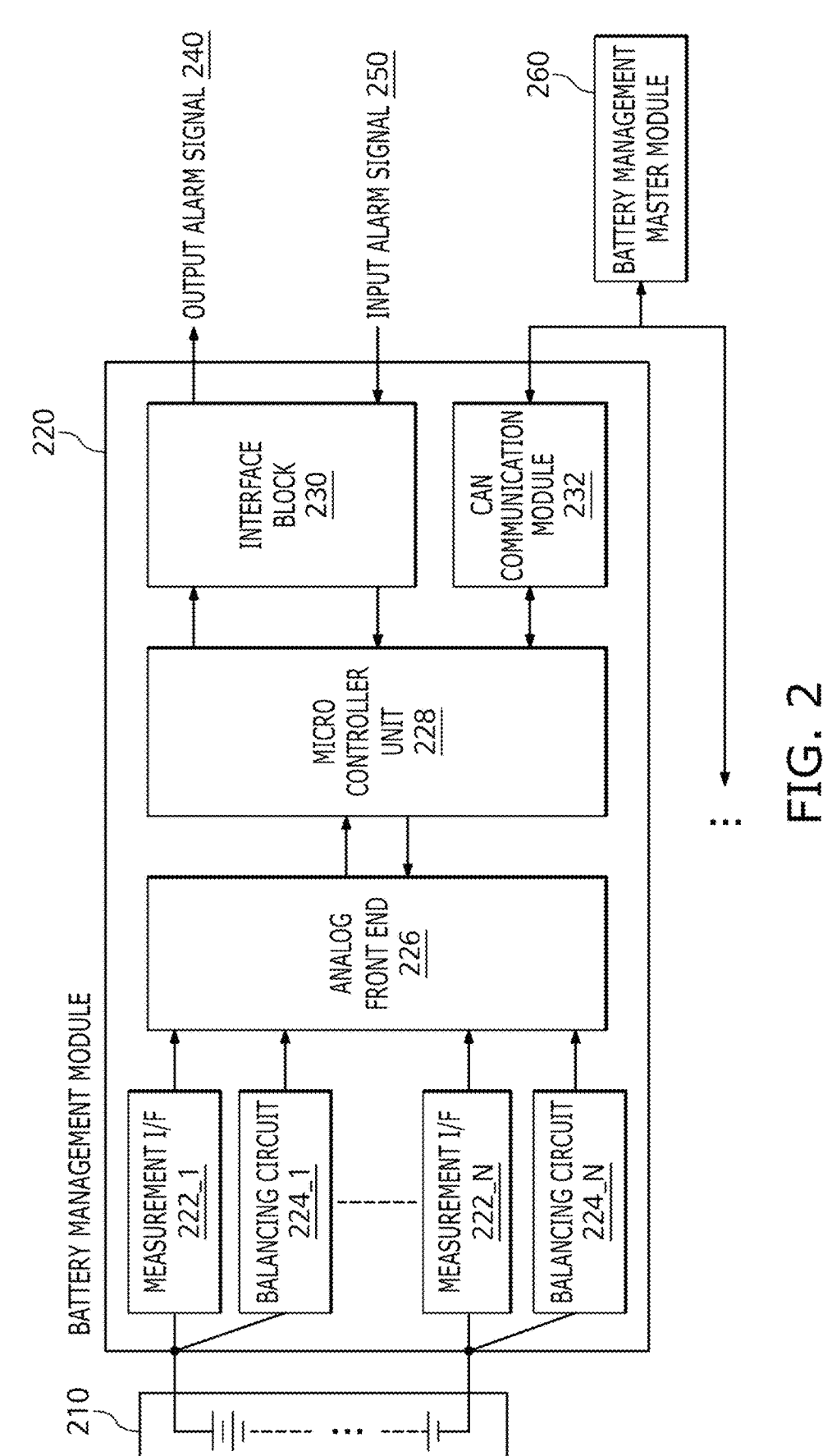
FIG. 2 is a block diagram of a battery management system according to one or more embodiments of the present disclosure.

FIG. 2 is a block diagram of a battery management system 200 according to one or more embodiments of the present disclosure. Referring to FIG. 2, a battery management module 220 may be configured to measure the states of battery cells from a battery module 210 and transmit state information to a battery management master module 260 and/or a subsequent battery management module. For example, the battery management module 220 may receive state information of the battery cells from the battery module 210 and transmit the received state information to the battery management master module 260 and/or the subsequent battery management module. To this end, the battery management module 220 may include measurement interfaces 222_1 to 222_N, balancing circuits 224_1 to 224_N, an analog front end 226, a microcontroller unit 228, an interface block 230 and a CAN communication module 232.

The battery management module 220 may be connected to the battery module 210, which may include a plurality of battery cells. The battery management module 220 may be configured to monitor respective states of the battery cells. For example, the measurement interfaces 222_1 to 222_N and the balancing circuits 224_1 to 224_N may respectively measure, from the battery cells of the battery module 210, states of the battery cells, such as voltages, currents, temperatures and the like of the battery cells.

The analog front end 226 may measure the state of the battery cell, such as the voltage, the current, the temperature, and the like of the battery cell, which are analog signals, through each of the measurement interfaces 222_1 to 222_N and each of the balancing circuits 224_1 to 224_N and convert them into digital signals. For example, the analog front end 226 may receive state information including the voltage, the current, the temperature, and the like of the battery cell, which are the analog signals, from each of the measurement interfaces 222_1 to 222_N and each of the balancing circuits 224_1 to 224_N and convert them into the digital signals. The analog front end 226 may transmit the converted digital signals to the microcontroller unit 228.

The microcontroller unit 228 may monitor the state of each battery cell based on the state information including the voltage, the current, the temperature and the like of each battery cell, which is received from the analog front end 226. For example, the microcontroller unit 228 may determine whether each battery cell is in an overvoltage or undervoltage state based on at least one of the voltage, the current, the temperature, and the like included in the state information of the corresponding battery cell. In another example, the microcontroller unit 228 may detect a voltage difference between battery cells based on at least one of the voltage, the current, the temperature, and the like included in the state information of each of the battery cells. Further, if the microcontroller unit 228 detects the voltage difference between the battery cells, the voltage difference between the battery cells may be adjusted by the balancing circuits 224_1 to 224_N to balance the voltage between the battery cells.

In some embodiments, the battery management module 220 may be configured to transmit information associated with the states of the battery cells in a daisy-chain fashion to the battery management master module 260. More specifically, the microcontroller unit 228 may receive, as an input alarm signal 250, an alarm signal that is output from a preceding battery management module (not shown) through the interface block 230. Further, the microcontroller unit 228 may transmit, as an output alarm signal 240, an alarm signal including the state information of the battery cells of the current battery management module 220 to a subsequent battery management module (not shown) through the interface block 230. Here, the state information of the battery cells included in the preceding battery management module and the state information of the battery cells of the current battery management module may each include, but is not limited to, the accumulated state information of the battery cells for the preceding battery management modules connected in a daisy chain manner. In such a case, each of the first battery management module and the last battery management module may be connected to the battery management master module 260.

In some embodiments, the battery management module 220 may transmit the state information of the battery module 210 (e.g., the state information of the battery cells, etc.) and the state information of the battery management module 220 (e.g., failure information of the battery management module, etc.) directly to the battery management master module 260. For example, the microcontroller unit 228 may transmit the state information of the battery module 210 and the state information of the battery management module 220 to the battery management master module 260 through the CAN communication module 232. In such a case, all of the battery management modules may communicate directly with the battery management master module 260 through CAN communication.

Figure 3:
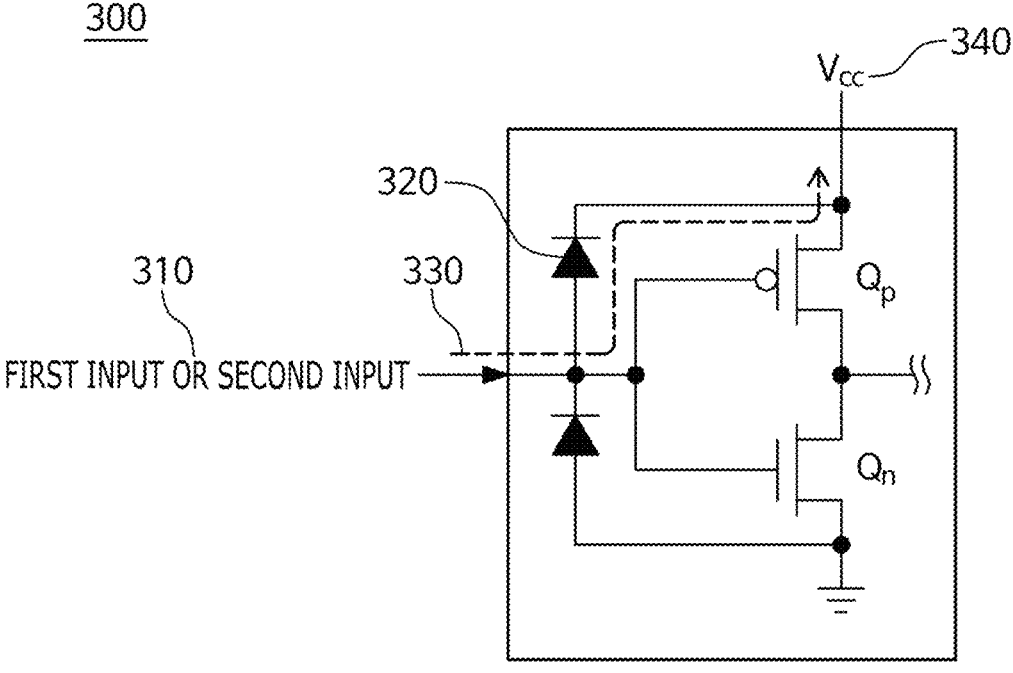
FIG. 3 is a diagram illustrating an example of an abnormal power supply state of a NAND gate in a battery management module according to one or more embodiments of the present disclosure.

FIG. 3 is a diagram illustrating an example of an abnormal power supply state of a NAND gate 300 in a battery management module according to one or more embodiments of the present disclosure. The NAND gate 300 may be included in, for example, the interface block 230 shown in FIG. 2.

The NAND gate 300 may be configured to receive two input signals. If the first input signal or the second input signal 310 of the NAND gate 300 is a high-level signal, a current path 330 may be formed by an input protection diode 320 to supply a Vcc power, so that the NAND gate 300 may output the same output signal as when it is operating normally, even if the Vcc power source 340 is defective due to soldering or a short circuit. In other words, even if the Vcc power source 340 is defective, in the case where the first input signal and the second input signal are both high-level signals, the NAND gate 300 outputs the same low-level signal as when the NAND gate is operating normally, so that a defect in the NAND gate circuit cannot be detected.

To address the aforementioned problems, the battery management module according to one or more embodiments of the present disclosure may be configured to monitor state information of the battery cell in a normal operating mode and determine whether the battery management module is defective in connection with the battery module tester in the EOL test stage. For example, the battery management module may determine that the NAND gate circuit is defective if the NAND gate outputs a low-level signal instead of an expected high-level signal during the EOL test stage.

Figure 4:
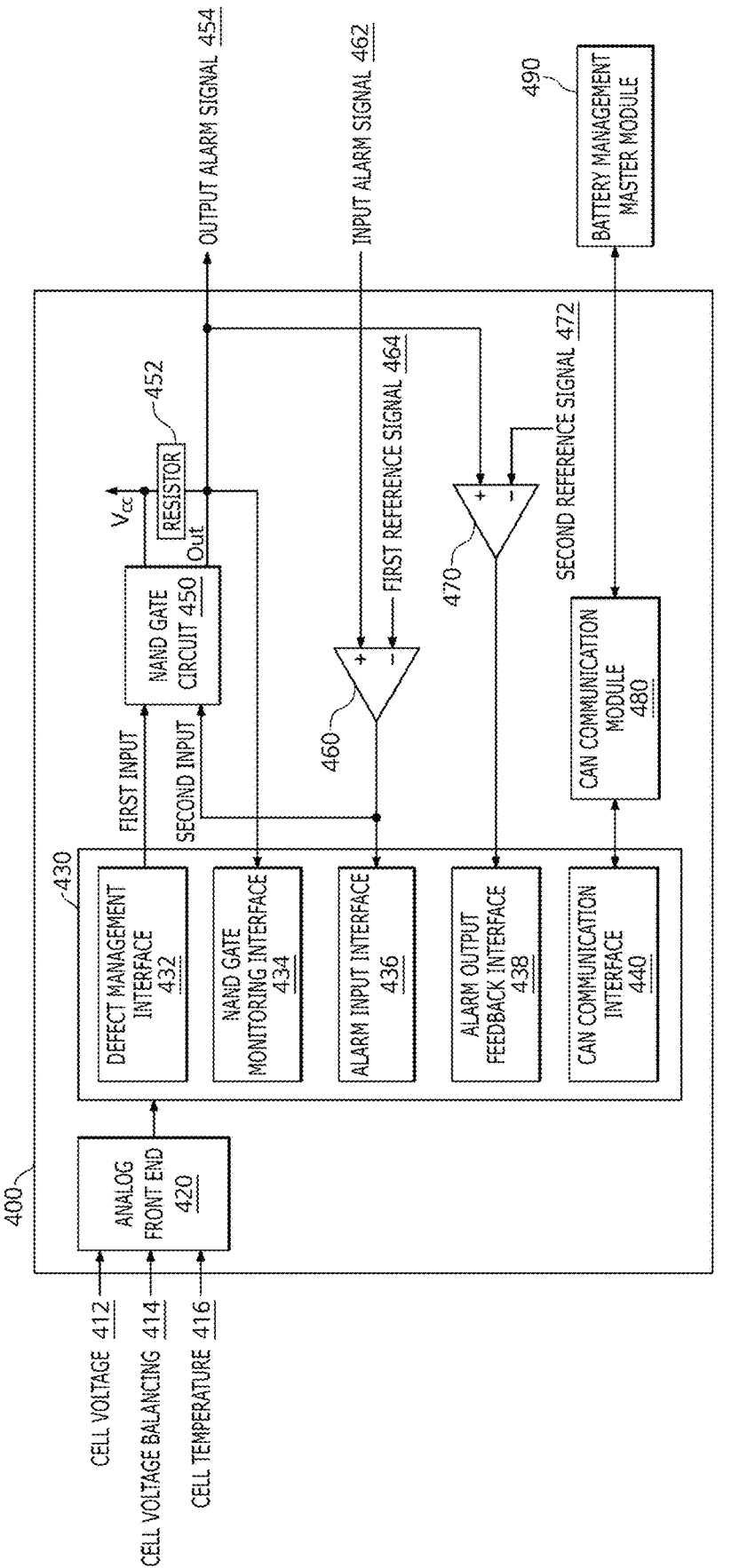
FIG. 4 is a block diagram of a battery management module in a normal operating mode according to one or more embodiments of the present disclosure.

FIG. 4 is a block diagram of a battery management module 400 in a normal operating mode according to one or more embodiments of the present disclosure. As shown in FIG. 4, the battery management module 400 may include an analog front end 420, a microcontroller unit 430, a NAND gate circuit 450, a first comparator 460, a second comparator 470 and a CAN communication module 480. The NAND gate circuit 450, the first comparator 460 and the second comparator 470 may be included in the interface block 230 of FIG. 2.

The analog front end 420 may be configured to measure a voltage of a battery cell, a voltage balancing of the battery cell and a temperature of the battery cell through a measurement interface and respective balancing circuits. For example, the analog front end 420 may receive voltage measurement information 412 of the battery cell, voltage balancing information 414 of the battery cell, and temperature measurement information 416 of the battery cell through the measurement interface and the respective balancing circuits. The cell voltage balancing information 414 of the battery cell may be a measurement value received from, for example, the balancing circuits 224_1 to 224_N shown in FIG. 2.

The microcontroller unit 430 may include a defect management interface 432, a NAND gate monitoring interface 434, an alarm input interface 436, an alarm output feedback interface 438 and a CAN communication interface 440.

The microcontroller unit 430 may transmit, as an output alarm signal 454, an alarm signal that is associated with a preceding battery management module and the current battery management module to a subsequent battery management module (not shown) through the NAND gate circuit 450. If the output signal of the NAND gate circuit is a low-level signal, it may indicate that at least one of the battery cells has an overvoltage state or an undervoltage state.

The microcontroller unit 430 may transmit a first input to the NAND gate circuit 450 through the defect management interface 432. Further, the first comparator 460 may be configured to receive, as an input alarm signal 462, an alarm signal received from the preceding battery management module (not shown), and compare the input alarm signal 462 with a first reference signal 464 to output a first comparison result. If the alarm signal received from the preceding battery management module is a low-level signal, it may indicate at least one of the preceding battery cells associated with the preceding battery management module has an overvoltage state or an undervoltage state. The outputted first comparison result may be input to the alarm input interface 436 of the microcontroller unit 430 and may be input to the NAND gate circuit 450 as a second input.

The NAND gate circuit 450 may receive a first input from the microcontroller unit 430 and a second input that is the first comparison result output from the first comparator 460 to generate an output signal thereof. The output signal of the NAND gate circuit 450 may be transmitted as an output alarm signal 454, an alarm signal associated with the preceding battery management module and the current battery management module to the subsequent battery management module (not shown).

An output terminal of the NAND gate circuit 450 may be connected to a pull-up resistor 452, which may be a feedback circuit for monitoring the NAND gate circuit 450. For example, one end of the pull-up resistor 452 may be connected to the output terminal of the NAND gate circuit 450, the NAND gate monitoring interface 434 and the second comparator 470. Further, the other end of the pull-up resistor 452 may be connected to a power source (Vcc) of the NAND gate circuit 450.

The second comparator 470 may compare the output signal of the NAND gate circuit 450 with a second reference signal 472 and output a second comparison result. The outputted second comparison result may be input to the microcontroller unit 430 through the alarm output feedback interface 438 to monitor the output signal of the NAND gate circuit 450.

The microcontroller unit 430 may transmit, through the CAN communication interface 440, state information of the battery management module, which is determined based on at least one of the voltage measurement information (voltage measurement value) 412 of the battery cell, the temperature measurement information (temperature measurement voltage) 416 of the battery cell, the output signal of the NAND gate circuit 450, the first comparison result, or the second comparison result, to the battery management master module 490. For example, the microcontroller unit 430 may output the state information of the battery management module to the CAN communication module 480 through the CAN communication interface 440, and the CAN communication module 480 may be in CAN communication with the battery management master module 490 to transmit the state information of the battery management module 400.

Figure 5:
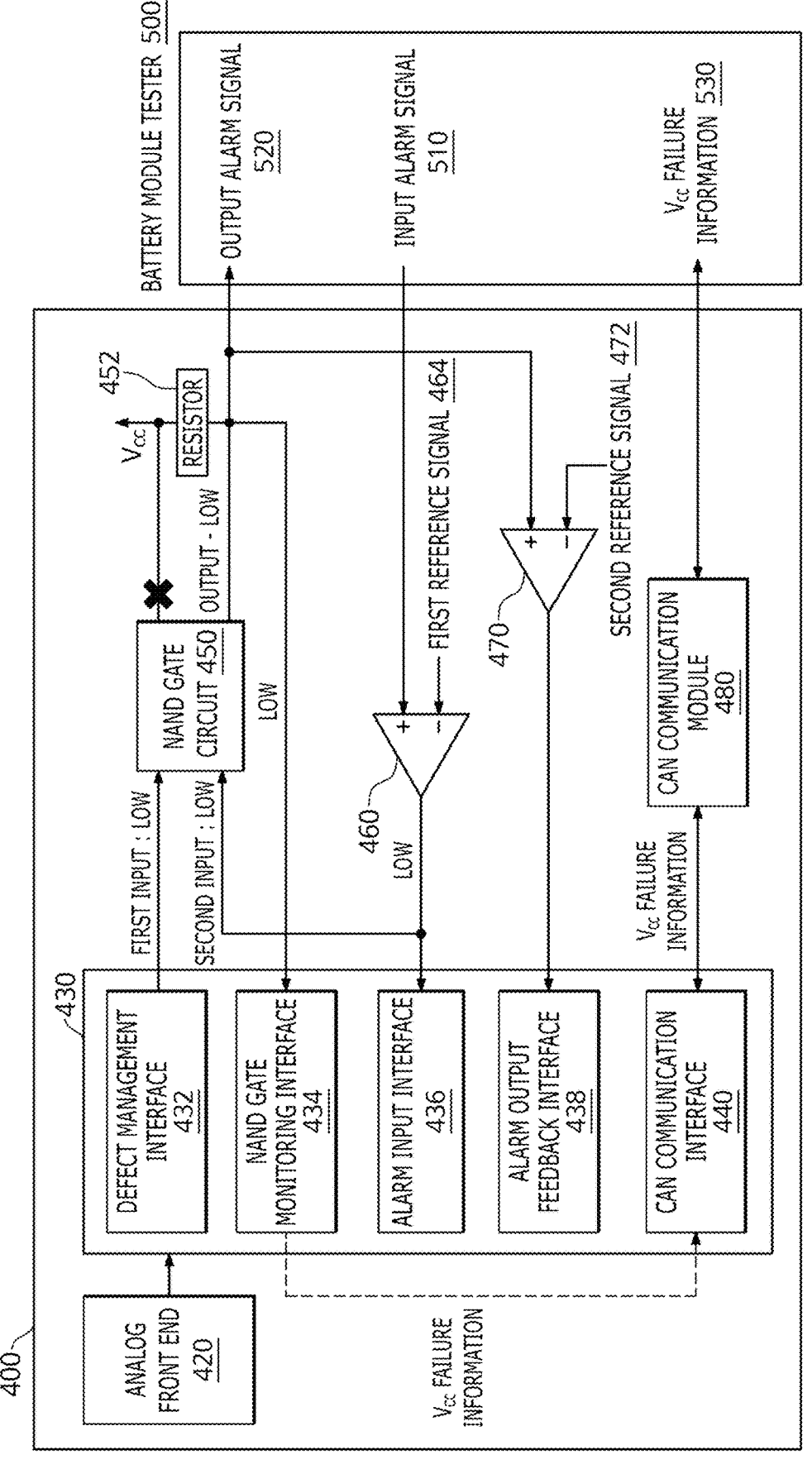
FIG. 5 is a block diagram of a battery management module in an inspection mode according to one or more embodiments of the present disclosure.

FIG. 5 is a block diagram of the battery management module 400 in an inspection mode according to one or more embodiment of the present disclosure. In FIG. 5, components having substantially the same function and configuration as those in FIG. 4 will be briefly described based on the embodiment shown in FIG. 5 or omitted.

Referring to FIG. 5, in the inspection mode of the battery management module 400, the battery management module 400 may be connected to a battery module tester 500. The inspection mode may refer to the operating state in the EOL test stage rather than the general (normal) operating state of the battery management module 400. In this case, the battery management module 400 may not be connected to the battery module 310, the preceding battery management module, the subsequent battery management module, or the battery management master module 490.

In the inspection mode, the microcontroller unit 430 may output a low-level signal as the first input of the first comparator 460 through the defect management interface 432. The first comparator 460 may be connected to the battery module tester 500, which may transmit, as an input alarm signal 510, the low-level signal to the first comparator 460. The first comparator 460 may receive the input alarm signal 510 from the battery module tester 500 and output the low-level signal as a first comparison result. For example, the first comparator 460 may output a low-level signal as the first comparison result upon receiving an input signal with a voltage lower than a voltage of the first reference signal 464 from the battery module tester 500.

The NAND gate circuit 450 may receive, as the first input, the low-level signal output from the microcontroller unit 430 and may also receive, as the second input, the first comparison result that is the low-level signal output from the first comparator 460 to thereby generate an output signal. The microcontroller unit 430 may be configured to receive the output signal of the NAND gate circuit 450 and determine that the NAND gate circuit is defective in response to the output signal of the NAND gate circuit 450 being a low-level signal. In a more specific example, under a condition where Vcc power is normally and properly applied to the NAND gate circuit 450, the NAND gate circuit 450 may output a high-level signal if both the first input and the second input of the NAND gate circuit 450 are low-level signals. However, under a condition where Vcc power is not normally and properly applied to the NAND gate circuit 450, for example, due to a short circuit, the NAND gate circuit 450 may output a low-level signal instead of the expected high-level signal if both the first input and the second input of the NAND gate circuit 450 are low-level signals.

In the inspection mode, if the output signal of the NAND gate circuit 450 is a low-level signal, the low-level signal may be input to the NAND gate monitoring interface 434 through the pull-up resistor 452 disposed between the output terminal of the NAND gate circuit 450 and the Vcc power source of the NAND gate circuit 450. In such a case, the microcontroller unit 430 may detect an abnormal state of the Vcc power of the NAND gate circuit 450 (i.e., a defect (failure) of the NAND gate circuit) based on the low-level output signal of the NAND gate circuit 450 input through the NAND gate monitoring interface 434. Additionally, in the inspection mode, the battery module tester 500 may receive, as an output alarm signal 520, the output signal of the NAND gate circuit 450. In that case, the battery module tester 500 may detect an abnormal state of the Vcc power of the NAND gate circuit 450 (i.e., a defect (failure) of the NAND gate circuit) in response to the output alarm signal 520 being a low-level signal.

In some embodiments, the microcontroller unit 430 may be configured to transmit a signal associated with the defect of the NAND gate circuit 450 to the battery module tester 500 in response to determining that the NAND gate circuit 450 is defective. For example, the signal associated with the defect of the NAND gate circuit 450 (e.g., Vcc failure information 530) may be transmitted to the battery module tester 500 through the CAN communication interface 440 of the microcontroller unit. In case of a short circuit between the NAND gate circuit 450 and the Vcc power source, the battery module tester 500 may detect the abnormal state of the power supply to the NAND gate circuit 450 of the corresponding battery management module 400 by detecting the low-level signal received through the CAN communication module 480.

FIG. 6 is a flowchart of a method 600 for detecting a defective NAND gate circuit in a battery management module (e.g., battery management module 400 in FIG. 5) according to one or more embodiments of the present disclosure. The method 600 may be initiated by connecting a battery management module serving as an inspection target to a battery module tester 500 in an inspection mode (step S610).

Thereafter, the microcontroller unit may output a low-level signal through a defect management interface 432 (step S620). Further, a comparator 460 configured to receive an input signal from the battery module tester 500 and compare the input signal with a reference signal to output a comparison result may output a low-level signal (step S630). For example, the comparator may receive an input signal with a voltage lower than a voltage of the reference signal from the battery module tester and output a low-level signal as the comparison result.

The NAND gate circuit may receive a low-level signal from a defect management interface 432 of the microcontroller unit 430 as a first input (step S640), and the NAND gate circuit 450 may also receive the low-level signal from the comparator 460 as a second input (step S650).

The NAND gate circuit 450 may then output a low-level signal based on the first input and the second input. If the output signal of the NAND gate circuit is the low-level signal, the microcontroller unit 430 may determine that the NAND gate circuit 450 is defective (step S660). For example, the microcontroller unit 430 may receive the output signal of the NAND gate circuit 450 through a NAND gate monitoring interface 434 and, in response to determining that the received output signal of the NAND gate circuit 450 is the low-level signal, the microcontroller unit 430 may detect the defect of the NAND gate circuit 450. In this case, the defect of the NAND gate circuit may be indicative of an abnormal power supply state of the NAND gate circuit. Additionally or alternatively, in response to the battery module tester 500 receiving the output signal of the NAND gate circuit 450 and determining that the output signal is the low-level signal, the battery module tester 500 may detect a defect of the NAND gate circuit.

In some embodiments, in response to determining that the NAND gate circuit 450 is defective, the microcontroller unit 430 may transmit a signal associated with the defect of the NAND gate circuit to the battery module tester 500. For example, the signal associated with the defect of the NAND gate circuit 450 may be transmitted to the battery module tester 500 through the CAN communication interface 440 of the microcontroller unit 430. In such a case, the battery module tester 500 may receive the signal associated with the defect of the NAND gate circuit 450 and detect the defect of the NAND gate circuit.

Figure 7:
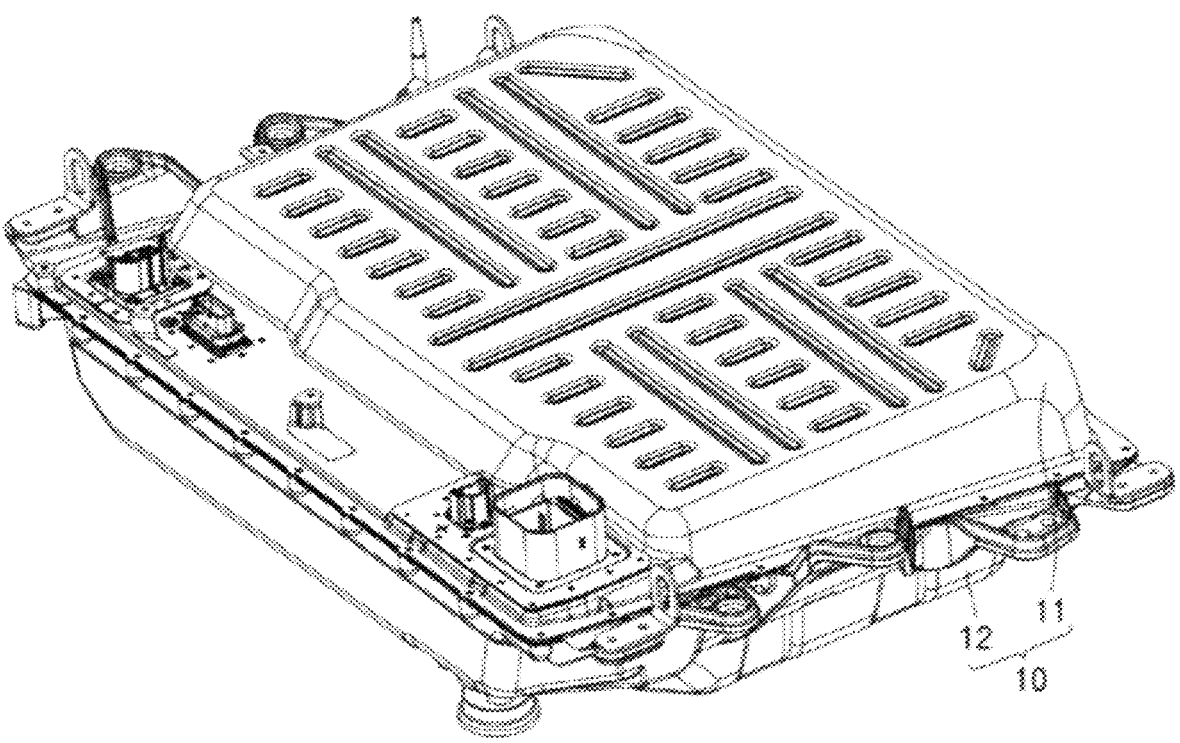
FIG. 7 is a diagram illustrating an example of a battery pack according to one or more embodiments of the present disclosure.
Figure 8:
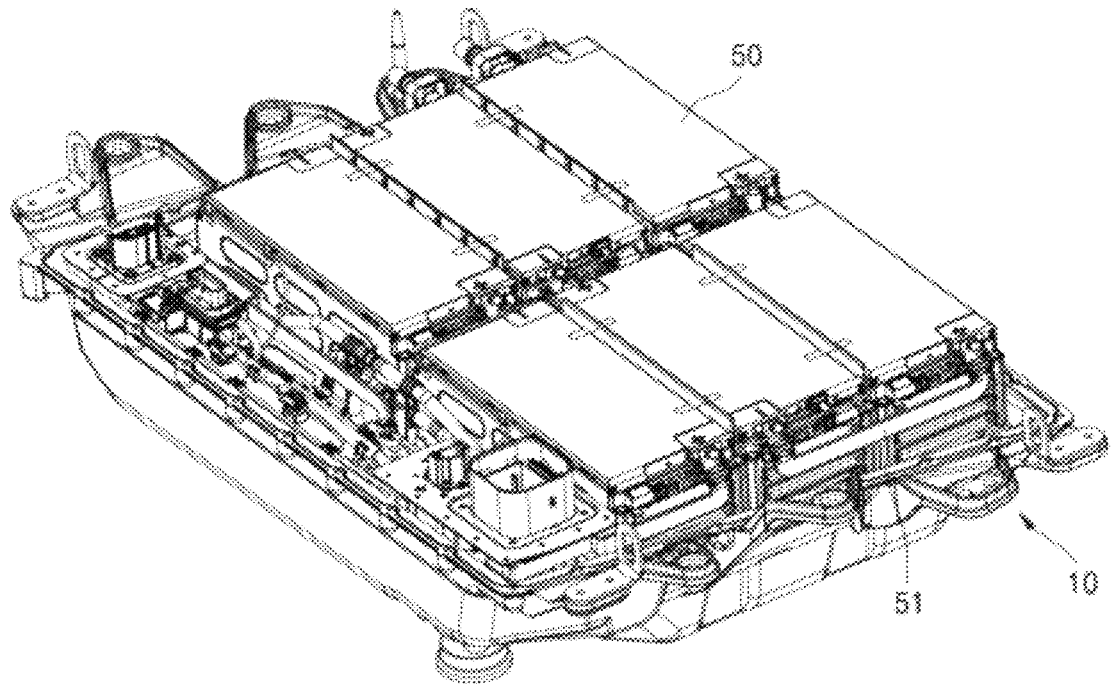
FIG. 8 is a diagram illustrating another example of a battery pack according to one or more embodiments of the present disclosure.

FIGS. 7 and 8 are each a diagram illustrating an example of a battery pack according to one or more embodiments of the present disclosure.

The battery pack may include a plurality of battery modules 50 and a housing 10 for accommodating the plurality of battery modules 50. For example, the housing 10 may include first and second housings 11 and 12 coupled in opposite directions through the plurality of battery modules 50. The plurality of battery modules 50 may be electrically connected to each other by using a bus bar 51, and the plurality of battery modules 50 may be electrically connected to each other in a series/parallel or series-parallel mixed method, thereby obtaining desired (e.g., required) electrical output. The battery pack may also include, for example, the battery management system 100 shown in FIG. 1 that is described with reference to FIGS. 1, 2, and 4 to monitor the voltage, the current, the temperature, and the like of the battery cell so that the state of the battery cell may be monitored to manage battery charging and discharging. The battery management system may include battery management modules, each of which may include a NAND gate circuit that is determined to be normal by a battery module tester during the EOL test stage of the battery management module manufacturing process.

Figure 9:
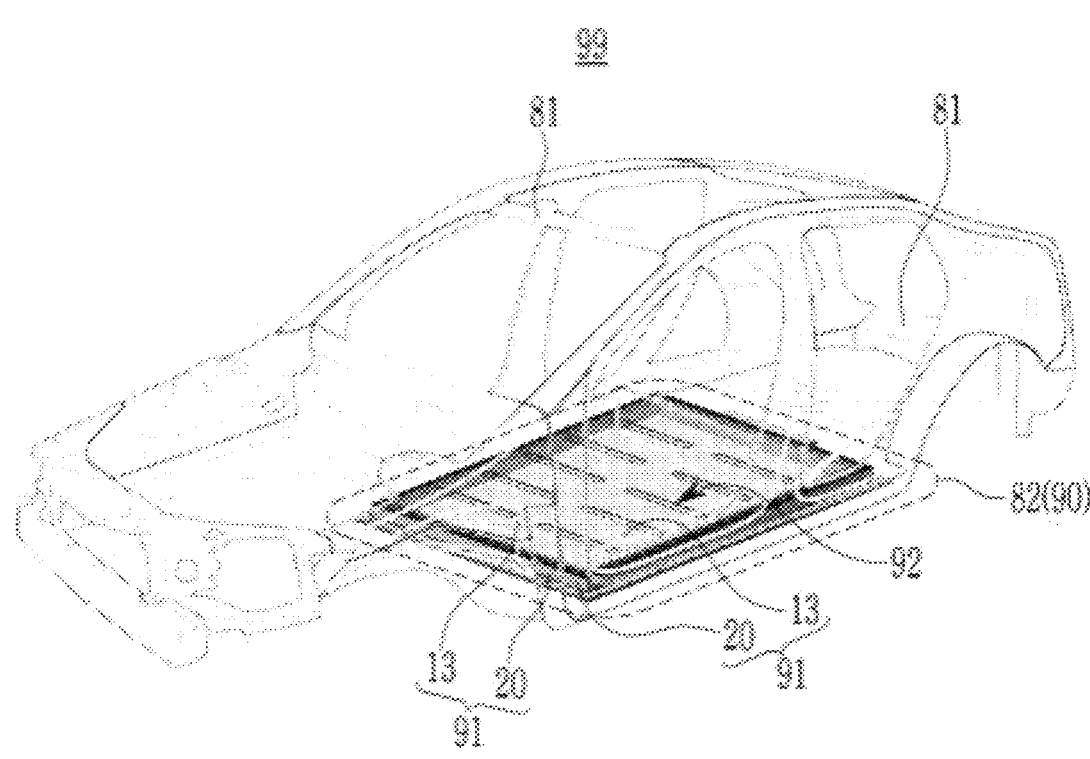
FIG. 9 is a diagram illustrating an example of a vehicle body and body parts including a battery pack according to one or more embodiments of the present disclosure.
Figure 10:
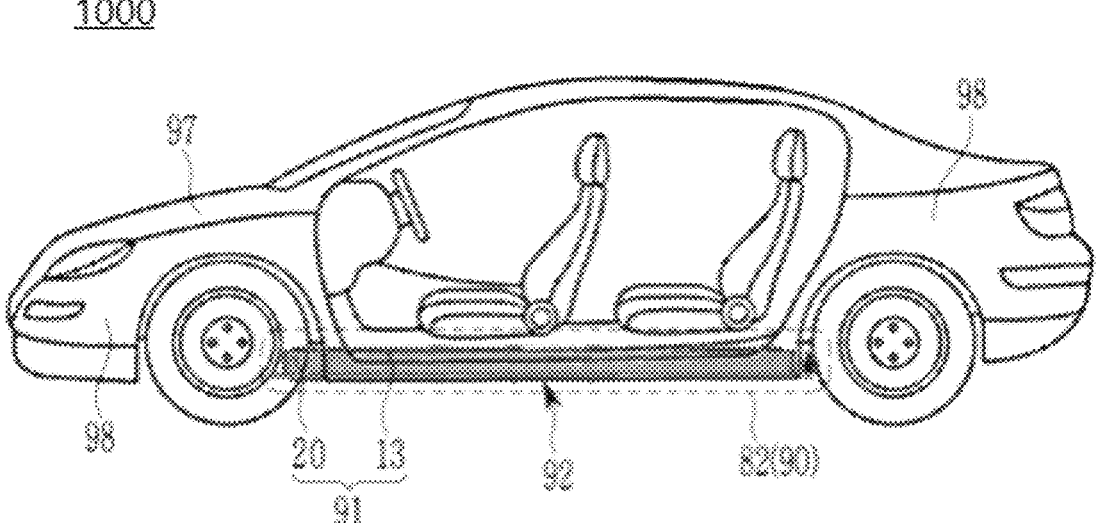
FIG. 10 is a diagram illustrating another example of a vehicle body and body parts including a battery pack according to one or more embodiments of the present disclosure.

FIGS. 9 and 10 are each a diagram illustrating an example of a vehicle body and body parts including a battery pack according to one or more embodiments of the present disclosure.

In FIG. 9, a battery pack 91 may include a battery pack cover 13, which is a part of a vehicle underbody 92, and a pack frame 20 disposed under the vehicle underbody 92. The pack frame 20 and the battery pack cover 13 may be integrally formed with a vehicle floor 82. Here, the pack frame 20 may refer to a housing for accommodating the battery modules in the battery pack.

In some embodiments, the pack frame 20 may refer to a housing for accommodating the battery modules in the battery pack.

The vehicle underbody 92 separates the inside and outside of a vehicle, and the pack frame 20 may be disposed outside the vehicle.

FIG. 10 is a schematic side view of a vehicle according to one or more embodiments of the present disclosure.

A vehicle 1000 may be formed by combining additional parts, such as a hood 97 in front of the vehicle and fenders 98 respectively located in the front and rear of the vehicle to a vehicle body 99.

The vehicle 1000 may further include a vehicle floor 82, which is one of the vehicle body parts 90 including the battery pack 91 including the pack frame 20 and the battery pack cover 13.

Although the present disclosure has been described above with respect to embodiments thereof, the present disclosure is not limited thereto. Various modifications and variations can be made thereto by those skilled in the art within the spirit of the present disclosure and the equivalent scope of the appended claims.

According to some embodiments of the present disclosure, the defective NAND gate circuit in the battery management module can be easily and quickly detected during the end-of-line test (EOL test) stage of the battery management module manufacturing process, thereby reducing the defect rate of the battery management module.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery management module, comprising:

a microcontroller unit;

a first comparator configured to compare an input signal with a first reference signal and output a first comparison result; and a NAND gate circuit configured to receive a first input from the microcontroller unit and a second input that is the first comparison result from the first comparator to generate an output signal, wherein, in an inspection mode, the first comparator is connected to a battery module tester, the microcontroller unit outputs a low-level signal as the first input, the first comparator receives the input signal from the battery module tester and outputs a low-level signal as the first comparison result, and the microcontroller unit is further configured to receive the output signal of the NAND gate circuit and determine that the NAND gate circuit is defective in response to a case where the output signal of the NAND gate circuit is a low-level signal.

2. The battery management module as claimed in claim 1, further comprising:

a pull-up resistor having one end connected to an output terminal of the NAND gate circuit and the other end connected to a power source of the NAND gate circuit; and a second comparator configured to compare the output signal of the NAND gate circuit with a second reference signal and output a second comparison result, wherein an output terminal of the first comparator is connected to an alarm input interface included in the microcontroller unit, an output terminal of the second comparator is connected to an alarm output feedback interface included in the microcontroller unit, and the one end of the pull-up resistor is additionally connected to a NAND gate monitoring interface included in the microcontroller unit.

3. The battery management module as claimed in claim 1, wherein, in the inspection mode, the first comparator receives the input signal, which has a voltage lower than that of the first reference signal, from the battery module tester and outputs the low-level signal as the first comparison result.

4. The battery management module as claimed in claim 1, wherein the defective NAND gate circuit is indicative of an abnormal power supply state of the NAND gate circuit.

5. The battery management module as claimed in claim 2, wherein, in the inspection mode, the microcontroller unit receives the low-level signal output from the NAND gate circuit through the NAND gate monitoring interface, and the microcontroller unit is further configured to detect the defective NAND gate circuit based on the received low-level signal.

6. The battery management module as claimed in claim 1, wherein, in the inspection mode, the microcontroller unit is further configured to, in response to the determination of the defective NAND gate circuit, transmit a signal associated with the defect of the defective NAND gate circuit to the battery module tester.

7. The battery management module as claimed in claim 6, wherein the signal associated with the defect of the defective NAND gate circuit is transmitted to the battery module tester through a controller area network communication interface included in the microcontroller unit.

8. The battery management module as claimed in claim 2, wherein, in a normal operating mode, the battery management module is connected to at least one of a battery cell, a preceding battery management module, a subsequent battery management module and a battery management master module.

9. The battery management module as claimed in claim 8, wherein, in the normal operating mode, the microcontroller unit is further configured to receive a voltage measurement value of the at least one battery cell or a temperature measurement value of the at least one battery cell.

10. The battery management module as claimed in claim 8, wherein, in the normal operating mode, an alarm signal received from the preceding battery management module is used as the input signal of the first comparator.

11. The battery management module as claimed in claim 10, wherein, in the normal operating mode, if the alarm signal received from the preceding battery management module is a low-level signal, the low-level signal indicates that at least one preceding battery cell included in the preceding battery management module has an overvoltage state or an undervoltage state.

12. The battery management module as claimed in claim 8, wherein, in the normal operating mode, the output signal of the NAND gate circuit is transmitted to the subsequent battery management module.

13. The battery management module as claimed in claim 12, wherein, in the normal operating mode, if the output signal of the NAND gate circuit is the low-level signal, the low-level signal indicates that the at least one battery cell has an overvoltage state or an undervoltage state.

14. The battery management module as claimed in claim 8, wherein, in the normal operating mode, the microcontroller unit is further configured to transmit, to the battery management master module, state information of the battery management module, the state information being determined using at least one of a voltage measurement value of at least one battery cell, a temperature measurement value of at least one battery cell, the output signal of the NAND gate circuit, the first comparison result and the second comparison result.

15. A method for detecting a defective NAND gate circuit in a battery management module, the method comprising, in an inspection mode:

connecting a battery management module serving as an inspection target to a battery module tester;

outputting, by a microcontroller unit, a low-level signal through a defect management interface included in the microcontroller unit;

outputting, by a comparator, a low-level signal, wherein the comparator is configured to receive an input signal from the battery module tester and compare the input signal with a reference signal to output a comparison result;

receiving, by a NAND gate circuit, a first input that is the low-level signal transmitted from the defect management interface included in the microcontroller unit;

receiving, by the NAND gate circuit, a second input that is the low-level signal transmitted from the comparator;

outputting, by the NAND gate circuit, a low-level signal based on the first input and the second input; and determining, by the microcontroller unit, that the NAND gate circuit is defective if an output signal of the NAND gate circuit is the low-level signal.

16. The method as claimed in claim 15, wherein the outputting, by the comparator, of the low-level signal comprises:

receiving from the battery module tester the input signal having a voltage lower than that of the reference signal and outputting the low-level signal as the comparison result.

17. The method as claimed in claim 15, wherein the defective NAND gate circuit is indicative of an abnormal power supply state of the NAND gate circuit.

18. The method as claimed in claim 15, wherein the determining, by the microcontroller unit, that the NAND gate circuit is defective comprises:

receiving, by the microcontroller unit, the output signal of the NAND gate circuit through a NAND gate monitoring interface; and detecting, by the microcontroller unit, the defective NAND gate circuit in response to determining that the received output signal of the NAND gate circuit is the low-level signal.

19. The method as claimed in claim 15, further comprising:

transmitting, by the microcontroller unit, a signal associated with a defect of the defective NAND gate circuit to the battery module tester in response to determining that the NAND gate circuit is defective.

20. The method as claimed in claim 19, wherein the signal associated with the defect of the defective NAND gate circuit is transmitted to the battery module tester through a controller are network communication interface included in the microcontroller unit.

* * * * *